United States Patent [19]

Dory

[11] Patent Number: 4,877,651

[45] Date of Patent: Oct. 31, 1989

[54] PROCESS FOR THERMALLY DEPOSITING SILICON NITRIDE AND SILICON DIOXIDE FILMS ONTO A SUBSTRATE

[75] Inventor: Thomas S. Dory, New Haven, Conn.

[73] Assignee: Olin Corporation, Cheshire, Conn.

[21] Appl. No.: 200,203

[22] Filed: May 31, 1988

[51] Int. Cl.$^4$ ............... C23C 16/34; C23C 16/40
[52] U.S. Cl. ............... 427/255; 427/255.2; 427/255.3; 437/238; 437/241; 437/243
[58] Field of Search ............... 427/255, 255.2, 255.3, 427/58; 437/238, 241, 243

[56] References Cited

U.S. PATENT DOCUMENTS

| | | | |
|---|---|---|---|
| 3,540,926 | 11/1970 | Rairden, III | 427/255.2 |
| 3,652,331 | 3/1972 | Yamazaki | 427/255.2 |
| 4,142,004 | 2/1979 | Hauser, Jr. et al. | 427/39 |
| 4,279,947 | 7/1981 | Goldman et al. | 427/255.2 |
| 4,500,483 | 2/1985 | Veltri et al. | 264/81 |
| 4,634,605 | 1/1987 | Wiesmann | 427/255.2 |
| 4,657,777 | 4/1987 | Hirooka et al. | 427/39 |
| 4,681,653 | 7/1987 | Purdes et al. | 156/614 |
| 4,686,112 | 8/1987 | Hoffmann | 427/255.3 |
| 4,696,834 | 9/1987 | Varaprath | 437/223 |
| 4,699,825 | 10/1987 | Sakai et al. | 428/337 |
| 4,720,395 | 1/1988 | Foster | 437/241 |
| 4,738,873 | 4/1988 | Roba et al. | 427/255.3 |
| 4,756,977 | 7/1988 | Haluska et al. | 427/255.2 |

OTHER PUBLICATIONS

Watanabe et al., "A Simple and Convenient Method for Preparing Di-t-Butylsilanes", Chemistry Letters, pp. 1321–1322 (1981).
K. Triplett et al., "Synthesis and Reactivity of Some t-butyl-disilanes and digermanes", J. of Organometallic Chemistry, vol. 107, pp. 23–32, 1976.
Doyle et al., "Hindered Organosilicon Compounds Synthesis and Properties of Di-tert-butyl, Di-tert-butylmethyl- and Tri-tert-butylsilanes" J. American Chemical Society, 97, pp. 3777–3782 (1975).
Chemical Abstracts, vol. 38, 126375t.
Chemical Abstracts, vol. 101, 91218.
Watanabe et al., "Properties of Silicon Nitride Films Prepared by Plasma-Enhanced Chemical Vapor Deposition of $SiH_4$—$N_2$ Mixtures" Thin Solid Films, 136, pp. 77–83 (1986).

*Primary Examiner*—Sadie Childs
*Attorney, Agent, or Firm*—William A. Simons

[57] ABSTRACT

A thermal CVD process for forming silicon nitride-type or silicon dioxide-type films onto a substrate comprising the steps of:
(a) introducing di-tert-butylsilane and at least one other reactant gas into a CVD reaction zone containing said substrate on which either a silicon nitride-type or silicon dioxide-type film is to be formed;
(b) maintaining the temperature of said zone and said substrate from about 450° C. to about 900° C.;
(c) maintaining the pressure in said zone from about 0.1 to about 10 Torr; and
(d) passing said gases into contact with said substrate for a period of time sufficient to form a silicon nitride-type or silicon dioxide-type film thereon.

20 Claims, No Drawings

PROCESS FOR THERMALLY DEPOSITING SILICON NITRIDE AND SILICON DIOXIDE FILMS ONTO A SUBSTRATE

CROSS-REFERENCE TO RELATED PATENT APPLICATIONS

This application is related to U.S. patent application entitled "Process For Plasma Depositing Silicon Nitride And Silicon Dioxide Films Onto A Substrate", Ser. No. 07/200,202, filed in the name of the same inventor simultaneously with this patent application.

BACKGROUND OF THE INVENTION

1. Field of the Invention

The present invention relates to a process for thermally depositing silicon nitride or silicon dioxide films onto a substrate. In particular, the present invention relates to a process for thermally depositing silicon nitride or silicon dioxide films onto a substrate wherein di-ter-butylsilane is employed as a silicon source for these films.

2. Brief Description of the Prior Art

Chemical vapor deposition (CVD) is used throughout the microelectronics industry for semiconducting and insulating thin film deposition. When films such as silicon nitride ($Si_3N_4$) or silicon dioxide ($SiO_2$) are deposited, silane ($SiH_4$) is generally used as the gaseous silicon source.

Silicon nitride and dioxide, important materials in the production of integrated circuits, are used as gate dielectrics, diffusion masks, and passivation films. Silicon nitride has a high dielectric strength, excellent barrier properties against impurity diffusion, and good chemical stability. Silicon dioxide has good insulating properties and is chemically stable for these applications.

Silane is highly toxic and spontaneously flammable in air. It requires the use of expensive gas cabinets and a cross purging gas supply system. Special purging procedures are needed before introduction into deposition equipment. A number of silicon containing chemicals have been used or proposed as silicon sources for nitride and oxide CVD. These include silicon tetrachloride ($SiCl_4$), silicon tetrabromide ($SiBr_4$), silicon tetrafluoride ($SiF_4$), dichlorosilane ($SiH_2Cl_2$), and disilane ($Si_2H_6$). Other chemicals such as tetramethylorthosilicate [TMOS, $Si(OCH_3)_4$], tetraethylorthosilicate [TEOS, $Si(OC_2H_5)$] and tetramethylcyclotetrasiloxane (TMCTS, $C_4H_{16}Si_4O_2$) are used only for oxide deposition. All of the above halogen containing silanes are toxic and corrosive themselves in addition to producing toxic and corrosive by-products. Disilane is a flammable, toxic gas that requires similar handling procedures to silane. Presently, if a microelectronics manufacturer wants to limit its use of silane, TMOS, TEOS and TMCTS are the only commercially feasible alternatives for silicon dioxide deposition. There are no commercially feasible alternatives to silane for silicon nitride deposition.

Accordingly, there is a need for better alternatives to silane in these CVD processes. The present invention is a solution to that need.

Separately, di-tert-butylsilane (DTBS) is a known chemical with a Chemical Abstracts registry number [30736-07-3]. Processes for making DTBS are disclosed by Watanabe et al "A Simple and Convenient Method for Preparing Di-t-Butyl Silanes", *Chemistry Letters* pgs. 1321-1322, 1981; Doyle et al "Hindered Organosilicon Compounds. Synthesis and Properties of Di-tert-butyl-, Di-tert-butylmethyl-, and Tri-tert-butylsilanes", *J. Am. Chem. Soc.*, 97, pgs. 3777-3782 (1975) and Triplett et al, "Synthesis and Reactivity of Some 1 t-Butyl-Disilanes and Digermanes", *Journal of Organometallic Chemistry*, Vol. 107, pgs. 23-32 (1976). All three of these articles are incorporated herein by reference in their entireties. DTBS has been used as a silylation agent to hydroxy compounds (CA 101: 91218v) and as an intermediate in the production of di-tert-butyldichlorosilane (CA 98: 126375t).

Di-tert-butylsilane is an air-stable, non-corrosive liquid. It is soluble in many organic solvents and does not react with water. Its high vapor pressure at room temperature allows for easy introduction into CVD reactors. No gas cabinets or cross purging systems are needed in order to use this chemical in CVD reactors. The decomposition by-products are not corrosive in nature. Thus, according to the present invention, di-tert-butylsilane represents a silicon source that may be used for both nitride and oxide deposition.

BRIEF SUMMARY OF THE INVENTION

Accordingly, the present invention is directed to a thermal CVD process for forming silicon nitride-type or silicon dioxide-type films onto a substrate comprising the steps of:

(a) introducing di-tert-butylsilane and at least one other reactant gas into a CVD reaction zone containing said substrate on which either a silicon nitride-type or silicon dioxide-type film is to be formed;

(b) maintaining the temperature of said zone and said substrate from about 450° C. to about 900° C.;

(c) maintaining the pressure in said zone from about 0.1 to about 10 Torr; and (d) passing said gases into contact with said substrate for a period of time sufficient to form a silicon nitride-type or silicon dioxide-type film thereon.

DETAILED DESCRIPTION

The CVD process of this invention may be used to produce silicon nitride-type or $Si_3N_4$-type films having an optimum refractive index in the range from about $2.0 \pm 0.2$. The lower the refractive index in this range, the higher the N percentage, and the higher the refractive index in this range, the higher the Si percentage. The terms "silicon nitride-type films" and "$Si_3N_4$-type films" as used herein mean films formed with a refractive index in the above optimum range.

The CVD process of this invention may also be used to produce silicon dioxide-type or $SiO_2$ films having an optimum refractive index in the range from about $1.46 \pm 0.2$. The lower the refractive index in this range, the higher the O percentage, and the higher the refractive index in this range, the higher the Si percentage. The terms "silicon dioxide-type films" and "$SiO_2$-type films" as used herein mean films formed with a refractive index in the above optimum range.

Substrates may be any material on which a silicon nitride, silicon dioxide-type film is desired, e.g. Si wafers, plastic, resin, glass or metal objects or films; GaAs layers; or any semiconductor layer or device employing Groups III to V elements or compounds, such as NMOS system gates in integrated circuit technology. The substrate is heated to the reaction temperature by a resistance element in a reaction chamber into which the gases are introduced. In a preferred embodiment of the process, the reaction chamber is prepared for film production by the preliminary step of passivating the chamber with a silicon nitride-type or silicon dioxide-type film of this invention.

While not critical, it is preferred to maintain the reaction chamber isothermal, by which is meant having temperature variations throughout of less than 2° C., preferably ±1° C. The reactant gases are input at ambient temperature a sufficient distance from the wafers to be coated to permit the gases to reach reaction temperature. Compared to the wafer mass, the gases, at ambient temperature will not appreciably cool the wafer.

The gases may be introduced into a reaction chamber by separate inlet lines, or they may be premixed in a mixing manifold. The reaction gases are introduced in a substantially laminar flow over the substrate surface. The residence time over the substrate is kept short to eliminate substantial concentration variations over the wafer. The substrate, typically a Si wafer, is preferably confined in a manner so as to provide a reaction chamber wall to wafer edge spacing, and wafer to adjacent wafer spacing, such that the silicon nitride-type or silicon dioxide-type films produced by the process of this invention are substantially uniform across the wafer surface, i.e., do not exhibit substantial concavity (edge build-up) or convexity (center mounding). An example of appropriate spacing of wafer to wafer and wafers to chamber wall are discussed in Becker et al "Low-Pressure Deposition of High-Quality $SiO_2$ films by Pyrolysis of Tetraethylorthosilicate", *J. Vac. Soc. Technol. B*, Vol. 5, No. 6 pages 1555–1563 (Nov./Dec. 1987). Film uniformity obtained preferably exhibits less than ±3% thickness variation, both within (across) the wafers, and from wafer to wafer in a batch or production run.

Typical gas flow rates may be on the order of from about 50 to about 400 standard cc/min. for the DTBS, and from about 10 standard cc/min. to 1 standard L/min. for the other reactant gas or gases capable of reacting with the DTBS to form silicon nitride, (e.g. anhydrous ammonia or hydrazine) or silicon dioxide (e.g. oxygen). The preferred gas flow rate ranges are about 60–200 ccm and about 15–800 sccm, respectively. Setting the reaction chamber pressure and the flow rate of either reactant permits control of film properties, as expressed by the refractive index ($N_f$). Thus, for a given pressure and DTBS flow rate, decreasing or increasing either the $NH_3$ or $O_2$ flow rate varies the $N_f$ of the film. Moreover, increasing the chamber pressure reduces the $N_f$ because more carbon becomes incorporated in the film.

As mentioned above, the reaction chamber pressures are controlled in the range of from about 0.1 Torr. to about 10 Torr. for both types of depositions. The preferred range being from about 0.2 to about 5 Torr. for both dioxide and nitride formation. As also mentioned above, the reaction temperature of these types of thermal deposition is from about 450° C. to about 900° C. The preferred temperature range for silicon dioxide deposition is 475° C. to 625° C. The preferred temperature range for silicon nitride deposition is about 575° C. to about 750° C.

The film formation rate is typically in the range of from about 10 to about 500 Angstroms/minute with typical operating rates for silicon dioxide being on the order of from about 30–300 Å/min., with the optimum being 75–200 Å/min. at an optimum pressure of about 0.4–2.0 Torr. at an optimum temperature range from about 500° C. to 600° C. For silicon nitride formation, the typical operating rates are also on the order of 30–300 Å/min., with the optimum being from about 75 to about 250 Å/min. at an optimum pressure range of 0.6–2.0 Torr. and at an optimum temperature range of 600° C. to about 700° C. Since the film composition may be changed by control of the relative flow rates of the reactants and the chamber pressure, this permits precise control of film properties.

The following examples further illustrate the present invention. All parts and percentages are by weight unless explicitly stated otherwise.

EXAMPLE 1

Preparation of Di-tert-butylsilane (DTBS)

Tert-butyllithium, $(CH_3)_3CLi$, [1.12 liters, (1.9 moles)] in pentane was added to a 2 liter flask containing hexane (about 200 ml) under a nitrogen atmosphere at room temperature. The flask was then cooled to −5° C. Dichlorosilane, $Cl_2SiH_2$, [65.53 g (1.0 mole)] was slowly added to the mixture in the cooled flask by means of cold finger. An immediate exothermic reaction and a white solid precipitate occurred.

Subsequent to addition, the mixture was stirred for two hours at −5° C. and then for two hours at room temperature. The white solid, lithium chloride, by-product was then removed by filtration and washed three times with pentane. The washings were combined with the filtrate. The combined filtrate and washings were then fractional distilled (pentane and hexane removed at about 70° C. and the desired product DTBS at about 126° C.) to recover the DTBS in about a 90% yield.

The recovered product was identified as di-tert-butylsilane by proton NMR and infrared spectroscopy.

EXAMPLE 2

Alternative Preparation of Di-tert-butylsilane (DTBS)

Tert-butyllithium, $(CH_3)_3CLi$ [0.30 liters, (0.51 moles)] in pentane was added to an empty 500 milliliter flask under a nitrogen atmosphere at 0° C. Tetrachlorosilane, $SiCl_4$, [42.5 g (0.25 moles)] was then added to the cooled flask. The mixture was stirred for 30 minutes at 0° C. No immediate reaction was observed. Next, the reaction mixture was stirred for 12 hours at room temperature. A white solid precipitate was then observed. Next, the majority of the pentane was removed by vacuum distillation and then replaced with 300 ml of heptane. This new reaction mixture was heated to reflux for a 48 hour duration. After this time, the cooled solution was combined with lithium aluminum hydride, $LiAlH_4$, [9.5 g (0.25 moles)] while maintaining the nitrogen atmosphere. This reaction solution was heated at reflux for 5 hours, then cooled to room temperature and the reaction mixture filtered to remove by-product salts. The resulting filtrate was slowly poured onto ice and a two phase solution resulted. The organic phase was separated from the aqueous phase and then dried using magnesium sulfate. The dried organic phase was then fractional distilled (heptane removed at 98° C. and the desired product DTBS at about 126° C.) to recover the DTBS in about an 80% yield.

The recovered product was identified as di-tert-butylsilane by proton NMR and infrared spectroscopy.

EXAMPLE 3

Thermal Deposition of Silicon Nitride ($Si_3N_4$) Employing DTBS As A Reactant

For this and the following Example, a Lindberg three zone horizontal tube furnace (Model 54657 manufactured by the Lindberg Furnace Co. of Watertown, Wis.) equipped with a quartz tube, quartz wafer boat, vacuum pumping system and gas supply system was used. The quartz wafer boat was fitted inside the quartz tube and held two inch silicon wafers in a vertical orientation. The loaded quartz wafer boat was placed in the second zone of the furnace.

After loading the furnace (previously heated to 600° C., 650° C. and 600° C. in three zones) with the quartz boat and about 5 wafers, the vacuum pumping system was turned on and the heated furnace evacuated to a base pressure of 0.050 Torr.

Anhydrous ammonia vapor at a flow rate of 18 sccm was introduced into the furnace through a mixing manifold attached to the door at the first zone of the furnace. Soon after the ammonia flow was started, DTBS vapor was simultaneously introduced into the mixing manifold at a flow of 68 sccm. The DTBS was vaporized before entering the manifold by slightly warming (about 30° C.) under vacuum.

While in the mixing manifold, the two vapors were intimately mixed, then entered the furnace through the first zone. The introduction of the gases into the furnace established the deposition pressure in the furnace at 1.7 Torr.

Reaction and decomposition of the gases formed silicon nitride films on the surfaces of the silicon wafers in the quartz wafer boat. After 30 minutes, the gas mixture was shut off and nitrogen gas introduced to purge the system. The system was vented and the loaded quartz boat removed.

The silicon nitride films on the silicon wafers were examined. The average nitride film thickness was 2844 Angstroms as determined by means of an ellipisometer. The average refractive index was 1.956 as determined by the ellipisometer. The dielectric constant of one random film was determined to be 4.34. The dielectric strength was $2.74 \times 10^6$ V/cm. A sputtered AUGER profile indicated less than 5 atomic percent carbon in the film.

These results indicate that a good silicon nitride film was deposited on the silicon wafers.

EXAMPLE 4

Thermal Deposition of Silicon Dioxide ($SiO_2$) Employing DTBS As A Reactant

Using the same equipment as in Example 3, the three zones of the furnace were heated to 450° C., 500° C. and 550° C., respectively. The furnace was evacuated to a base pressure of 0.050 Torr.

Oxygen was introduced into the mixing manifold at a flow rate of 35 sccm and then DTBS vapor was introduced into the same manifold at 68 sccm. Again, the DTBS was vaporized prior to the introduction into the manifold by slightly warming (30° C.) under vacuum.

The gas mixture then entered the furnace through the first zone. The introduction of the gases into the furnace established the deposition pressure in the furnace at 1.8 Torr. Reaction and decomposition of gases formed silicon dioxide films on the surfaces of the silicon wafers in the quartz wafer boat. After 10 minutes, the gas mixture was shut off and nitrogen gas was introduced to purge the system. The system was vented and the loaded quartz boat removed.

The silicon dioxide films on the silicon wafers were examined. The average silicon dioxide film thickness was 937 Angstroms as determined by means of an ellipisometer. The average refractive index was 1.44 as determined by the ellipisometer. A sputtered AUGER profile indicated less than 5 atomic percent of carbon.

These results indicate that good silicon dioxide films were deposited on the silicon wafers.

What is claimed is:

1. A thermal CVD process for forming silicon nitride film having a refractive index from about 2.0±0.2 or silicon dioxide film having a refractive index from about 1.46±0.2 onto a substrate comprising the steps of:
    (a) introducing di-tert-butylsilane and at least one other reactant gas capable of reacting with said di-tert-butylsilane to form silicon nitride or silicon dioxide into a CVD reaction zone containing said substrate on which either a silicon nitride or silicon dioxide-type film is to be formed;
    (b) maintaining the temperature of said zone and said substrate from about 450° C. to about 900° C.;
    (c) maintaining the pressure in said zone from about 0.1 to about 10 Torr; and
    (d) passing said gases into contact with said substrate for a period of time sufficient to form a silicon nitride film having a refractive index from about 2.0±0.2 or silicon dioxide film having a refractive index from about 1.46±0.2 thereon.

2. The thermal CVD process of claim 1 wherein silicon nitride film is formed and said other gas is anhydrous ammonia.

3. The thermal CVD process of claim 2 wherein the flow rate of said di-tert-butylsilane into said zone is from about 50 sccm to about 400 sccm and the flow rate into said zone of said anhydrous ammonia is from about 10 sccm to about 1000 sccm.

4. The thermal CVD process of claim 3 wherein said zone temperature and said substrate temperature are from about 575° C. to about 750° C.

5. The thermal CVD process of claim 1 wherein silicon dioxide film is formed and said other gas is oxygen.

6. The thermal CVD process of claim 5 wherein the flow rate of said di-tert-butylsilane is from about 50 sccm to about 400 sccm and the flow rate of oxygen into said zone is from about 10 sccm to about 1000 sccm.

7. The thermal CVD process of claim 6 herein said zone temperature and said substrate temperature are from about 450° C. to about 650° C.

8. The thermal CVD process of claim 1 wherein said zone pressure is from about 0.2 Torr. to about 5 Torr.

9. The thermal CVD process of claim 1 wherein said film rate is maintained at a rate from about 10 to about 500 Angstroms/minute.

10. A thermal CVD process for forming silicon nitride having a refractive index from about 2.0±0.2 film onto a substrate comprising the steps of:
    (a) introducing di-tert-butylsilane and at least one other reactant gas into a CVD reaction zone containing said substrate on which said silicon nitride film is to be formed, said other gas is capable of reacting with said di-tert-butylsilane to form silicon nitride;
    (b) maintaining the temperature of said zone and said substrate from about 575° C. to about 750° C.;

(c) maintaining the pressure in said zone in the range from about 0.2 to about 5 Torr.; and (d) maintaining said gases into contact with said substrate for a period of time sufficient to form a silicon nitride film thereon having a refractive index from about 2.0±0.2.

11. The thermal CVD process of claim 10 wherein said other reactant gas is anhydrous ammonia.

12. The thermal CVD process of claim 11 wherein the flow rate of said di-tert-butylsilane into said zone is from about 50 sccm to about 200 sccm and the flow rate of said anhydrous ammonia is from about 15 sccm to about 800 sccm.

13. The thermal CVD process of claim 12 wherein said zone temperature and said substrate temperature are from about 600° C. to about 700° C. and said zone pressure is from about 0.6 Torr. to about 2 Torr.

14. A thermal CVD process for forming silicon dioxide having a refractive index from about 2.0±0.2 film onto a substrate comprising the steps of:

(a) introducing di-tert-butylsilane and at least one other reactant gas into a CVD reaction zone containing said substrate on which a silicon dioxide film is to be formed, said other gas or gases are capable of reacting with said di-tert-butylsilane to form silicon dioxide;

(b) maintaining the temperature of said zone and said substrate from about 475° C. to about 625° C.;

(c) maintaining the presence in said zone from about 0.2 to about 5 Torr., and (d) passing said gases into contact with substrate for a period of time sufficient to form a silicon dioxide film thereon having a refractive index from 1.46±0.2.

15. The thermal CVD process of claim 14 wherein said other reactant gas is oxygen.

16. The thermal CVD process of claim 15 wherein the flow rate of said di-tert-butylsilane into said zone is from about 50 sccm to about 200 sccm and the flow rate of said oxygen is from about 15 sccm to about 800 sccm.

17. The thermal CVD process of claim 16 wherein said zone temperature is from about 500° C. to about 600° C. and said zone pressure is from about 0.4 Torr. to about 2 Torr.

18. The thermal CVD process of claim 1 wherein said substrate is selected from the group consisting of resin objects or films, glass objects or films, metal objects or films, and semiconductor layers or devices.

19. The thermal CVD process of claim 13 wherein said substrate is selected from the group consisting of resin objects or films, glass objects or films, metal objects or films, and semiconductor layers or devices.

20. The thermal CVD process of claim 17 wherein said substrate is selected from the group consisting of resin objects or films, glass objects or films, metal objects or films, and semiconductor layers or devices.

* * * * *

UNITED STATES PATENT AND TRADEMARK OFFICE
CERTIFICATE OF CORRECTION

PATENT NO. : 4,877,651

DATED : October 31, 1989

INVENTOR(S) : Thomas S. Dory

It is certified that error appears in the above—identified patent and that said Letters Patent is hereby corrected as shown below:

In Column 6, line 56, after the word "film" insert --formation--.

In Column 6, line 59, after the word "nitride" insert --film--, and after "2.0 ± 0.2", delete "film".

Signed and Sealed this

Nineteenth Day of May, 1992

Attest:

DOUGLAS B. COMER

*Attesting Officer*   Acting Commissioner of Patents and Trademarks